(12) United States Patent
Kitaoka et al.

(10) Patent No.: US 7,288,152 B2
(45) Date of Patent: Oct. 30, 2007

(54) METHOD OF MANUFACTURING GAN CRYSTALS AND GAN CRYSTAL SUBSTRATE, GAN CRYSTALS AND GAN CRYSTAL SUBSTRATE OBTAINED BY THE METHOD, AND SEMICONDUCTOR DEVICE INCLUDING THE SAME

(75) Inventors: Yasuo Kitaoka, Ibaraki (JP); Hisashi Minemoto, Hirakata (JP); Isao Kidoguchi, Kawanishi (JP); Takatomo Sasaki, Suita (JP); Yusuke Mori, Katano (JP); Fumio Kawamura, Minoh (JP); Masanori Morishita, Ibaraki (JP)

(73) Assignees: Matsushita Electric Industrial Co., Ltd., Osaka (JP); Yusuke MORI, Osaka (JP)

( * ) Notice: Subject to any disclaimer, the term of this patent is extended or adjusted under 35 U.S.C. 154(b) by 394 days.

(21) Appl. No.: 10/884,386

(22) Filed: Jul. 2, 2004

(65) Prior Publication Data
US 2005/0048686 A1    Mar. 3, 2005

(30) Foreign Application Priority Data
Aug. 29, 2003  (JP)  ............................ 2003-306914
Mar. 24, 2004  (JP)  ............................ 2004-087743

(51) Int. Cl.
*C30B 11/14*  (2006.01)

(52) U.S. Cl. ............................. 117/81; 117/45; 117/78; 117/79; 117/82; 117/83

(58) Field of Classification Search .................. 117/81, 117/82, 83, 45, 78, 79
See application file for complete search history.

(56) References Cited

U.S. PATENT DOCUMENTS 5,637,531 A * 6/1997 Porowski et al. ............. 117/89

(Continued)

FOREIGN PATENT DOCUMENTS

| JP | 11-145516 | 5/1999 |
|---|---|---|
| JP | 2000-357663 | 12/2000 |
| JP | 2002--293696 | 10/2002 |
| JP | 3409576 | 3/2003 |
| JP | 2003-292400 | 10/2003 |
| WO | 2004/013385 | 2/2004 |

OTHER PUBLICATIONS

Masato Aoki et al., "Growth Conditions and Morphology of GaN Single Crystals Fabricated by the Na Flux Method", Journal of the Ceramic Society of Japan, 109 [10], pp. 858-862, 2001.

(Continued)

*Primary Examiner*—Robert Kunemund
(74) *Attorney, Agent, or Firm*—Hamre, Schumann, Mueller & Larson, P.C.

(57) ABSTRACT

The present invention provides a manufacturing method in which high quality GaN crystals and GaN crystal substrates can be manufactured under mild conditions of low pressure and low temperature. In a method of manufacturing GaN crystals in which in a gas atmosphere containing nitrogen, gallium and the nitrogen are allowed to react with each other to generate GaN crystals in a mixed melt of the gallium and sodium, the gallium and the nitrogen are allowed to react with each other under a pressurizing condition that exceeds atmospheric pressure, and pressure P1 (atm($\times 1.013 \times 10^5$ Pa)) of the pressurizing condition is set so as to satisfy the condition that is expressed by the following conditional expression (I):

$$P \leq P1 < (P+45), \qquad (I)$$

where in the expression (I), P (atm($\times 1.013 \times 10^5$ Pa)) denotes the minimum pressure that is required for generating GaN crystals at a temperature T° C. of the mixed melt.

28 Claims, 11 Drawing Sheets

U.S. PATENT DOCUMENTS

| | | |
|---|---|---|
| 5,868,837 A | 2/1999 | DiSalvo et al. |
| 6,121,121 A | 9/2000 | Koide |
| 6,252,255 B1 | 6/2001 | Ueta et al. |
| 6,270,569 B1 | 8/2001 | Shibata et al. |
| 6,447,604 B1 | 9/2002 | Flynn et al. |
| 6,503,610 B2 | 1/2003 | Hiramatsu et al. |
| 6,562,124 B1 * | 5/2003 | Ivantzov et al. ............. 117/29 |
| 6,592,663 B1 | 7/2003 | Sarayama et al. |
| 6,614,059 B1 | 9/2003 | Tsujimura et al. |
| 6,667,252 B2 | 12/2003 | Miyajima et al. |
| 2003/0042496 A1 | 3/2003 | Sasaoka |
| 2004/0124434 A1 | 7/2004 | D'Evelyn et al. |
| 2004/0134413 A1 * | 7/2004 | Iwata et al. .................... 117/2 |
| 2004/0144300 A1 | 7/2004 | Kitaoka et al. |
| 2004/0147096 A1 | 7/2004 | Kitaoka et al. |
| 2004/0183090 A1 | 9/2004 | Kitaoka et al. |
| 2005/0011432 A1 | 1/2005 | Kitaoka et al. |
| 2005/0082564 A1 | 4/2005 | Kitaoka et al. |
| 2006/0051942 A1 | 3/2006 | Sasaki et al. |

OTHER PUBLICATIONS

M. Morishita et al., "The growth mechanism of GaN single crystals in Na flux system", Journal of the Japanese Association for Crystal Growth, vol. 30, No. 3, 2003.

M. Morishita et al., "Growth of transparent GaN single crystals using LPE technique in Na flux system", Extended Abstracts (The 51st Spring Meeting, 2004); The Japan Society of Applied Physics and Related Societies, 29 p—YK-6.

Kozawa, et al., "Raman scattering from LO phonon-plasmon coupled modes in gallium nitride", Journal of Applied Physics, Jan. 15, 1994, 74(2), 1098-1101—Abstract Only.

Kawamura, et al., "Growth of a large GaN Single Crystal Using the Liquid Phase Epitaxy (LPE) Technique", Jpn. J. Applied Physics, vol. 42, Jan. 2003, pp. 4-6.

* cited by examiner

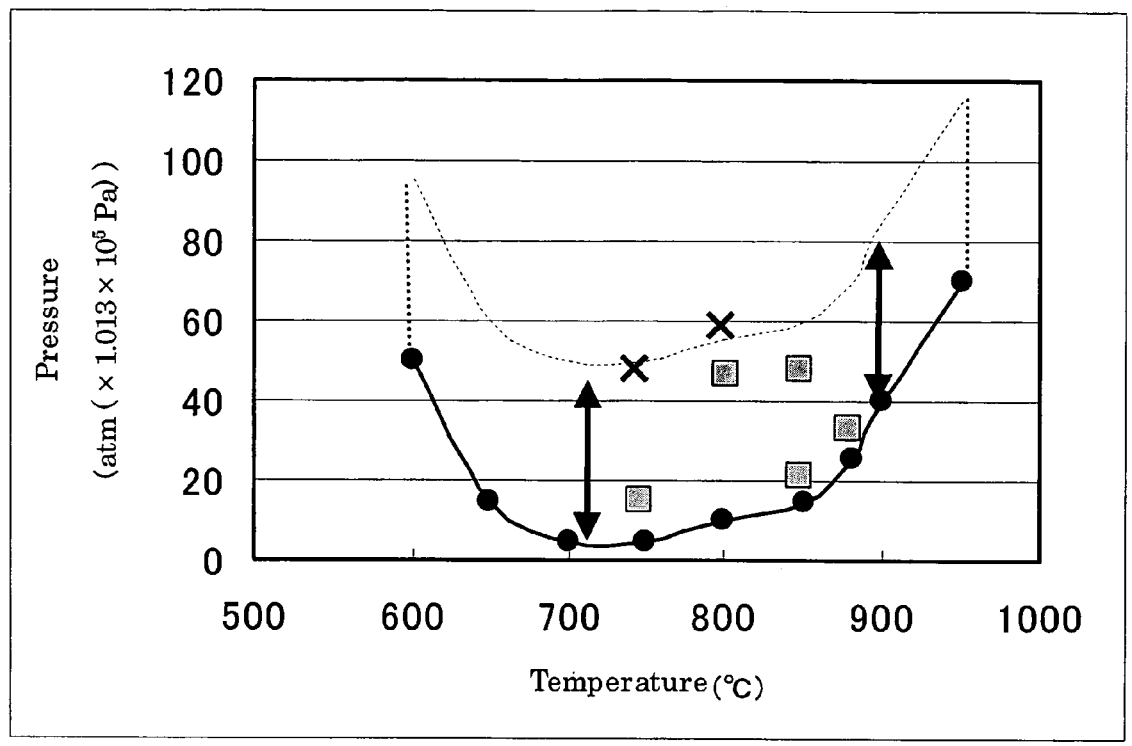
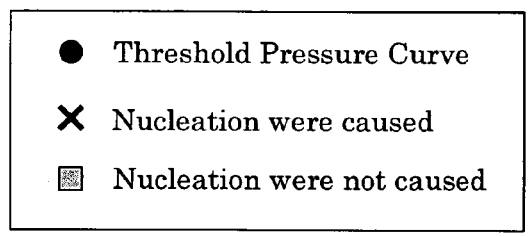
FIG.2

METHOD OF MANUFACTURING GAN CRYSTALS AND GAN CRYSTAL SUBSTRATE, GAN CRYSTALS AND GAN CRYSTAL SUBSTRATE OBTAINED BY THE METHOD, AND SEMICONDUCTOR DEVICE INCLUDING THE SAME

BACKGROUND OF THE INVENTION

1. Field of the Invention

The present invention relates to a method of manufacturing GaN crystals and a GaN crystal substrate, GaN crystals and a GaN crystal substrate obtained by the method, and a semiconductor device including the same.

2. Related Background Art

Gallium nitride (GaN) has been gaining attention as a material for semiconductor elements that emit blue or ultraviolet light. A laser diode (LD) that emits blue light is used for high-density optical disk devices or displays while a light emitting diode (LED) that emits blue light is used for displays, lighting, etc. It is expected to use an ultraviolet LD in the field of, for instance, biotechnology and an ultraviolet LED as, for example, an ultraviolet source for a fluorescent lamp.

Usually, GaN crystals that are used for LDs or LEDs are formed by heteroepitaxially growing GaN crystals on a sapphire substrate using vapor phase epitaxy. Generally, GaN crystals obtained by this method have a dislocation density of $10^8$ cm$^{-2}$ to $10^9$ cm$^{-2}$ and therefore have a problem in quality. For example, an epitaxial lateral overgrowth (ELOG) method has been developed as the method of solving this problem. With this method, the dislocation density can be reduced to about $10^5$ cm$^{-2}$ to $10^6$ cm$^{-2}$. This method, however, has a problem of its processes being complicated.

On the other hand, besides the vapor phase epitaxy, a method of growing crystals from a liquid phase also has been studied. However, since the equilibrium vapor pressure of nitrogen is at least 10000 atm (10000×1.013×10$^5$ Pa) at the melting point of GaN crystals, conventionally severe conditions including 8000 atm (8000×1.013×10$^5$ Pa) and 1200° C. are required for growing GaN crystals from a liquid phase. In order to solve this problem, a method using a Na flux has been developed. This method allows GaN crystals to be obtained under relatively mild conditions. Furthermore, a mixture of Ga and Na is pressurized and heated to be melted in a nitrogen gas atmosphere containing ammonia, then crystals are grown for 96 hours using the melt, and thereby single crystals whose maximum crystal size is about 1.2 mm have been obtained (see, for instance, JP2002-293696A).

Moreover, another method also has been reported in which a GaN crystal layer is formed on a sapphire substrate by a metalorganic chemical vapor deposition (MOCVD) method and then single crystals are grown by a liquid phase epitaxy (LPE) method.

These conventional methods, however, did not allow high quality GaN crystals to be manufactured under mild conditions.

SUMMARY OF THE INVENTION

Hence, with such situations in mind, the present invention is intended to provide: a method of manufacturing GaN crystals and a GaN crystal substrate that allows high quality GaN crystals and a high quality GaN crystal substrate to be manufactured under mild conditions; GaN crystals and a GaN crystal substrate that are obtained by the method; and a semiconductor device including the same.

In order to achieve the above-mentioned object, the method of manufacturing GaN crystals according to the present invention is one in which in a gas atmosphere containing nitrogen, gallium and the nitrogen are allowed to react with each other to generate GaN crystals in a mixed melt of the gallium and sodium. The gallium and the nitrogen are allowed to react with each other under a pressurizing condition that exceeds atmospheric pressure, and pressure P1 (atm(×1.013×10$^5$ Pa)) in a part or the whole of the pressurizing condition satisfies the condition that is expressed by the following conditional expression (I):

$$P \leq P1 < (P+45) \qquad (I),$$

where in the expression (I), P (atm(×1.013×10$^5$ Pa)) denotes the minimum pressure that is required for generating GaN crystals at a temperature T (° C.) of the mixed melt.

The present inventors and others made a series of studies concentrating on the Na flux method to manufacture high quality GaN crystals under mild conditions. In the course of the studies, the relationship between nitrogen and gallium in the Na flux was examined in detail.

That is, when GaN crystals are grown from a liquid phase using a Na flux, nitrogen contained in the atmosphere is ionized (radicalized) and then dissolves and reacts in a Ga/Na melt, resulting in a solution state of GaN. The amount of nitrogen that dissolves in the Ga/Na melt depends on the pressure of the nitrogen atmosphere. On the other hand, the solubility of GaN crystals in the Ga/Na melt depends on the temperature of the melt. The nitrogen that has been contained in the nitrogen atmosphere dissolves in the melt and reacts with Ga contained therein to form GaN crystals that dissolve in the Ga/Na melt. When the melt is supersaturated with the GaN crystals, the GaN crystals precipitate. With consideration given to the above, the following idea was obtained. That is, in order to grow high quality crystals steadily, it is necessary to determine the threshold pressure of the nitrogen atmosphere at which GaN crystals start precipitating (the minimum pressure that is required for generating a GaN crystal nucleus and allowing them to exist without disappearing (the minimum pressure that is required for generating GaN crystals at a temperature T (° C.) of the mixed melt)) at each temperature of the Ga/Na melt, using the temperature of the Ga/Na melt and the pressure of the nitrogen atmosphere as parameters. According to this idea, further studies were made. As a result, it was found that when the pressure P1 (atm(×1.013×10$^5$ Pa)) of the condition that is expressed by the above-mentioned expression (I) is employed, high quality GaN crystals can be manufactured under mild conditions of low pressure and low temperature. This finding resulted in the present invention. In the present invention, a part or the whole of GaN crystals may be generated under the condition that is expressed by the conditional expression (I). That is, GaN crystals obtained in the present invention are those, a part or the whole of which is manufactured under the condition that is expressed by the conditional expression (I).

With the method of manufacturing GaN crystals according to the present invention, GaN crystals and a GaN crystal substrate of high quality can be manufactured under mild conditions of lower pressure and lower temperature than those conventionally employed. In addition, it is possible to manufacture a high quality semiconductor device including GaN crystals and a GaN crystal substrate that are obtained by the above-mentioned method.

BRIEF DESCRIPTION OF THE DRAWINGS

FIG. 2 is a graph showing the minimum pressure that is required for generating GaN crystals according to one example of the present invention.

DETAILED DESCRIPTION OF THE INVENTION

Figure 1:
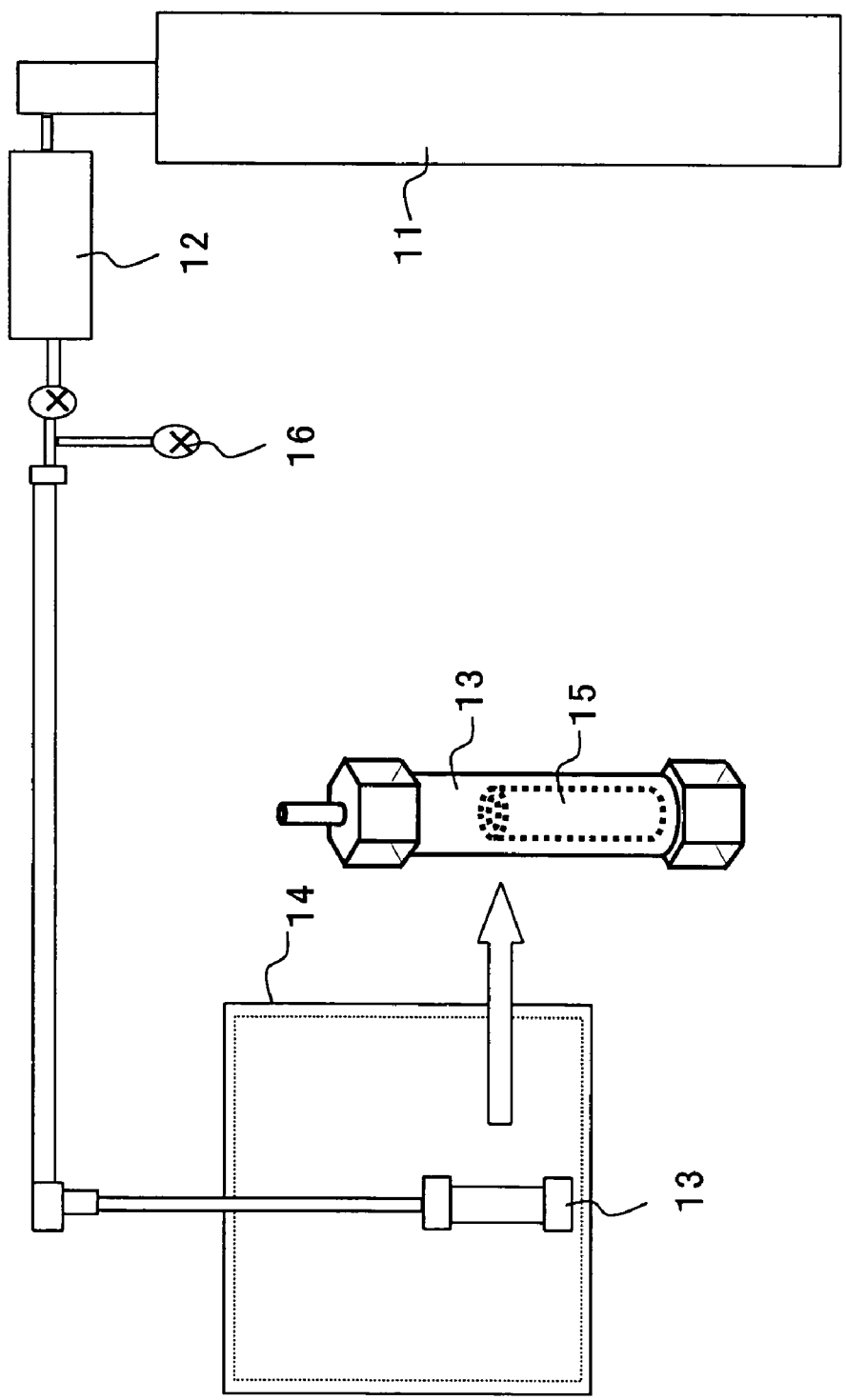
FIG. 1 is a schematic view showing the configuration of an example of the manufacturing apparatus to be used in the manufacturing method of the present invention.

In the method of manufacturing GaN crystals according to the present invention, it is preferable that the pressure P1(atm(×1.013×10$^5$ Pa)) of the pressurizing condition satisfies the condition that is expressed by the following conditional expression (II) instead of the conditional expression (I):

$$P \leq P1 \leq (P+30) \quad \text{(II)},$$

where in the expression (II), P (atm(×1.013×10$^5$ Pa)) denotes the minimum pressure that is required for generating GaN crystals at a temperature T (° C.) of the mixed melt. This condition allows GaN crystals of higher quality to be manufactured under milder conditions.

In the method of manufacturing GaN crystals according to the present invention, it is preferable that the pressure P1 (atm(×1.013×10$^5$ Pa)) of the pressurizing condition satisfies the condition that is expressed by the following conditional expression (III) instead of the conditional expression (I):

$$P \leq P1 \leq (P+15) \quad \text{(III)},$$

where in the expression (III), P (atm(×1.013×10$^5$ Pa)) denotes the minimum pressure that is required for generating GaN crystals at a temperature T (° C.) of the mixed melt. This condition allows GaN crystals of higher quality to be manufactured under milder conditions.

In the method of manufacturing GaN crystals according to the present invention, the temperature T (° C.) of the mixed melt is, for example, in the range of 600° C. to 1000° C., preferably in the range of 830° C. to 950° C. A temperature of 830° C. or higher of the mixed melt further can increase the solubility of the GaN crystals in the melt and thus further can increase the amount of GaN crystals that precipitate per unit time. In this case, the minimum pressures P (atm(× 1.013×10$^5$ Pa)) that are required for generating GaN crystals at various temperatures T (° C.) of the mixed melt are as follows:

| Mixed Melt Temperature T (° C.) | Minimum Pressure P required for generating GaN Crystals (atm (×1.013 × 10$^5$ Pa)) |
|---|---|
| 600 | 50 |
| 700 | 5 |
| 750 | 5 |
| 800 | 10 |
| 850 | 15 |
| 880 | 25 |
| 900 | 40 |
| 950 | 70 |

As described above, the GaN crystals grown at a pressure in the range expressed by the conditional expression (I), preferably the conditional expression (II), and more preferably the conditional expression (III) contain less impurities and thus are transparent crystals of high quality. Hence, it is preferable that a layer of a part of GaN crystals to be grown includes a GaN layer that is grown under the condition that is expressed by the conditional expression (I), preferably the conditional expression (II), and more preferably the conditional expression (III). When a high quality GaN layer is formed in the early or middle stage of the growth, a GaN layer with fewer dislocations can be formed on seed crystals. Thereafter, GaN crystals with a low dislocation density therefore can be grown thereon. When a high quality GaN layer is formed in the later stage of the growth, a substrate of high quality GaN layer with its surface, on which a device is to be formed, having a low dislocation density can be obtained and thereby the device performance can be improved.

The minimum pressure P (atm(×1.013×10$^5$ Pa)) that is required for generating GaN crystals can be used even when alkaline-earth metal or alkali metal other than Na is added to the Ga/Na melt. In this case, the ratio of the additive to the whole mixed melt is preferably 1 mol % or lower and more preferably 0.1 mol % or lower. For instance, as indicated in the below, Na contains trace amounts of, for example, Ca, K, etc. that vary depending on the purity of Na. The Ga/Na melt may contain such Na. Examples of the ratios of other components that vary depending on the purity of Na are indicated in the below.

(1) In the case of Na having a purity of 99.97%
K: 25 ppm, Ca: 4 ppm, Fe: 1 ppm, and Cl: 1.5 ppm
(2) In the case of Na having a purity of 99.5%
K: 100 ppm and Ca: 10 ppm
(3) In the case of Na having a purity of 99.0%
K: 3000 ppm and Ca: 300 ppm In the method of manufacturing GaN crystals of the present invention, with the pressure P1 (atm(×1.013×10$^5$ Pa)) of the pressurizing condition being kept constant, the temperature T (° C.) of the mixed melt preferably is changed stepwise or continuously and more preferably is increased stepwise or continuously. This is because when the temperature T (° C.) of the mixed melt is changed under a constant pressure condition, the growth rate can be controlled, and as a result, GaN crystals can grow in the melt under conditions that can diminish the occurrence of defects and the introduction of impurities and thereby higher transparency GaN crystals can be obtained. Furthermore, the ranges in which the temperature T (° C.) of the mixed melt is changed at various pressures P1 (atm($\times 1.013 \times 10^5$ Pa)) are, for example, as follows.

| Pressure P1 under Pressurizing Conditions (atm ($\times 1.013 \times 10^5$ Pa)) | Mixed Melt Temperature T (° C.) |
|---|---|
| 20 | 700–850 |
| 30 | 700–900 |
| 40 | 700–930 |

When being changed stepwise, the temperature may be changed in two stages or more. When being changed continuously, the temperature T (° C.) may be changed preferably at a rate of, for example, 0.1° C./hr to 10° C./hr, more preferably 0.5° C./hr to 5° C./hr.

In the method of manufacturing GaN crystals according to the present invention, with the temperature T (° C.) of the mixed melt being kept constant, the pressure P1 (atm($\times 1.013 \times 10^5$ Pa)) of the pressurizing condition preferably is changed stepwise or continuously, and more preferably is reduced stepwise or continuously. That is, when the pressure P1 (atm($\times 1.013 \times 10^5$ Pa)) of the pressurizing condition is changed under a constant temperature condition, the growth rate can be controlled. As a result, GaN crystals can grow in the melt under the conditions that can diminish the occurrence of defects and the introduction of impurities. Consequently, higher transparency GaN crystals can be obtained. In this case, the pressure P1 (atm($\times 1.013 \times 10^5$ Pa)) of the pressurizing condition is, for example, in the range expressed by the following conditional expression (III):

$$P \leq P1 \leq (P+15) \quad \text{(III)},$$

where in the conditional expression (III), P (atm($\times 1.013 \times 10^5$ Pa)) denotes a minimum pressure that is required for generating GaN crystals at a temperature T (° C.) of the mixed melt.

When being changed stepwise, the pressure P1 (atm($\times 1.013 \times 10^5$ Pa)) may be changed in two stages or more. When being changed continuously, the pressure P1 (atm($\times 1.013 \times 10^5$ Pa)) may be changed, for example, preferably at a rate of 0.01 atm ($\times 1.013 \times 10^5$ Pa)/hr to 1 atm ($\times 1.013 \times 10^5$ Pa)/hr, more preferably at a rate of 0.05 atm ($\times 1.013 \times 10^5$ Pa)/hr to 0.3 atm ($\times 1.013 \times 10^5$ Pa)/hr.

In the method of manufacturing GaN crystals of the present invention, preferably the growth rate is controlled. This is because the control of the growth rate can diminish the introduction of impurities and the occurrence of defects that are caused during the growth, and as a result, GaN crystals can grow under the conditions that can diminish the occurrence of defects and the introduction of impurities and thereby higher transparency GaN crystals can be obtained. The growth rate may be, for example, 1 µm/hr to 50 µm/hr, preferably 1 µm/hr to 25 µm/hr. In this case, the growth rate varies with, for instance, a stirring condition, a flux component, a crucible shape, and the area of crystal portions that come into contact with the ambient gas. For example, in order to obtain a high growth rate, it is preferable that the melting of nitrogen is promoted by stirring, a mixed flux having high nitrogen solubility such as a Na—Ca flux is used, the area of the crystal portions that come into contact with the ambient nitrogen gas is increased, etc.

In the method of manufacturing GaN crystals according to the present invention, it is preferable that a growth rate at which the GaN crystals grow is reduced stepwise or continuously. The growth rate can be reduced by, for instance, a method of decreasing the nitrogen solubility in the melt by reducing the growth pressure or a method of increasing the GaN solubility in the melt by raising the growth temperature. The growth rate may be, for example, a minimum of 1 µm/hr to 100 µm/hr and a maximum of 20 µm/hr to 500 µm/hr, preferably a minimum of 1 µm/hr to 70 µm/hr and a maximum of 20 µm/hr to 300 µm/hr, and further preferably a minimum of 1 µm/hr to 50 µm/hr and a maximum of 20 µm/hr to 100 µm/hr. The ratio (the minimum/the maximum) at which the growth rate is reduced is, for instance, 1% to 99%, preferably 20% to 90%, and further preferably 30% to 80%.

In the mixed melt of the present invention, a mole ratio of the gallium to the total of the gallium and the sodium (Ga/(Ga+Na)) is, for instance, in the range of 7% to 47%, preferably in the range of 17% to 37%. When the mole ratio is at least 7%, larger GaN crystals are obtained. In addition, when the mole ratio is 47% or lower, the yield of GaN crystals improves.

The GaN crystals of the present invention are obtained by the method of manufacturing GaN crystals of the present invention described above.

Preferably, the method of manufacturing a GaN crystal substrate of the present invention includes: preparing seed crystals of a Group III element compound that is expressed by a composition formula of $Al_uGa_vIn_{1-u-v}N$, where u and v satisfy relationships of $0 \leq u \leq 1$, $0 \leq v \leq 1$, and $u+v \leq 1$; and placing the seed crystals in the mixed melt to grow GaN crystals on the surfaces of the seed crystals by the manufacturing method according to the present invention. According to this method, a higher quality GaN crystal substrate can be manufactured under mild conditions.

In the method of manufacturing a GaN crystal substrate of the present invention, it is preferable that the seed crystals are formed as a layer on a substrate and the substrate then is placed in the mixed melt. Preferably, the substrate is a GaAs substrate whose surface is a (111) plane, a Si substrate whose surface is a (111) plane, a sapphire substrate whose surface is a (0001) plane, or a SiC substrate whose surface is a (0001) plane. Among them, the sapphire substrate whose surface is a (0001) plane is particularly preferable.

In the manufacturing method of the present invention, it is preferable that GaN single crystals are grown. This is because single crystals are of high quality.

The GaN crystal substrate of the present invention is obtained by the method of manufacturing a GaN crystal substrate of the present invention described above.

In the GaN crystal substrate of the present invention, it is preferable that an absorption coefficient (K1), with respect to light in the visible-light region, of a part located on the side of the seed crystals of the GaN crystals and an absorption coefficient (K2), with respect to light in the visible-light region, of a part located on the side of the exposed surface of the GaN crystals satisfy a relationship of K1>K2. This is because, for example, when an optical device is to be formed on the surface of the GaN crystal substrate, it is desired that the substrate include fewer impurities and defects. The absorption coefficient (K2), with respect to light in the visible-light region, of a part located on the side of the exposed surface of the GaN crystals preferably is in the range of higher than zero but not higher than 100 per cm, more preferably higher than zero but not higher than 10 per cm, and further preferably higher than zero but not higher than 5 per cm. The absorption coefficient can be determined by, for example, measuring transmittances of a sample at respective wavelengths with, for instance, a spectrophotometer, and using the transmittances and the thickness of the sample.

In the above, the "part located on the side of the seed crystals of the GaN crystals" denotes a region of GaN crystals that start growing from the seed crystals and has a thickness of, for instance, about 10 μm to 500 μm, which is measured from the plane in which the GaN crystals are in contact with the seed crystals. On the other hand, the "part located on the side of the exposed surface of the GaN crystals" denotes a region with a thickness of, for instance, about 10 μm to 500 μm, which is measured from a natural growth plane (for instance, a C plane) of the resultant GaN crystals.

In the GaN crystal substrate of the present invention, it is preferable that an amount of defects (N1) of the part located on the side of the seed crystals of the GaN crystals and an amount of defects (N2) of the part located on the side of the exposed surface of the GaN crystals satisfy a relationship of N1>N2. This is because, for example, when an optical device is to be formed on the surface of the GaN crystal substrate, it is desired that the substrate include fewer impurities and defects. The "amount of defects" means defects of Ga and Na contained in the GaN crystals as well as the amount of impurities introduced thereinto that originate from oxygen, a flux composition, crucible materials, a pressure-resistant container, etc. The amount of defects can be measured by, for instance, impurity analysis such as SIMS or optical evaluations such as, for instance, photoluminescence evaluations.

The amount of defects (N1) of the part located on the side of the seed crystals of the GaN crystals is, for example, 1 ppm to 10000 ppm, preferably 1 ppm to 1000 ppm. On the other hand, the amount of defects (N2) of the part located on the side of the exposed surface of the GaN crystals is, for instance, 0.001 ppm to 10 ppm, preferably 0.001 ppm to 1 ppm, and further preferably 0.001 ppm to 0.5 ppm.

The method of manufacturing a semiconductor device of the present invention is a method of manufacturing a semiconductor device including forming a semiconductor element on a substrate, wherein the substrate is manufactured by the manufacturing method of the present invention. In this manufacturing method, it is preferable that the semiconductor element to be formed on the substrate is any one of a laser diode, a light emitting diode, and a field effect transistor.

An example of the method of manufacturing GaN crystals of the present invention is described below.

FIG. 1 shows an example of the apparatus to be used in the manufacturing method of the present invention. As shown in the drawing, this apparatus includes a raw material gas tank 11, a pressure regulator 12, an electric furnace 14, and a pressure- and heat-resistant container 13. The raw material gas tank 11 is filled with nitrogen-containing gas. In the present invention, the type of the nitrogen-containing gas is not particularly limited. For example, nitrogen gas, ammonia gas, and a mixed gas thereof can be used. The nitrogen-containing gas may contain components other than nitrogen. The raw material gas tank 11 is connected to the pressure- and heat-resistant container 13 through a pipe and the pressure regulator 12 is disposed therebetween. The pressure of nitrogen-containing gas that has a pressure of, for instance, 100 atm ($100 \times 1.013 \times 10^5$ Pa) to 150 atm ($150 \times 1.013 \times 10^5$ Pa) in the raw material gas tank 11 can be regulated to 100 atm ($100 \times 1.013 \times 10^5$ Pa) or lower by the pressure regulator 12 to be supplied to the pressure- and heat-resistant container 13. In the drawing, numeral 16 denotes a relief valve. The pressure- and heat-resistant container 13 can be, for example, a stainless steel container. The pressure- and heat-resistant container 13 is disposed inside the electric furnace 14 and is heated by this. A crucible 15 is placed inside the pressure- and heat-resistant container 13, and gallium and sodium are put inside the crucible 15. In the present invention, besides gallium and sodium, other components may be put therein. For instance, doping impurities such as Mg, Ca, etc. may be added. The type of the crucible 15 is not particularly limited. For example, a BN crucible or an alumina crucible can be used. Furthermore, alkali metal (for example, Li or K) other than sodium may be included as long as its amount is a trace amount.

The production of GaN single crystals using this apparatus is carried out, for example, as follows. First, sodium and gallium are weighed in a glove box and then are put into the crucible 15. This crucible 15 is set inside the pressure- and heat-resistant container 13. Subsequently, nitrogen-containing gas is supplied to the pressure- and heat-resistant container 13 from the raw material gas tank 11 while its pressure is regulated by the pressure regulator 12 to be a predetermined pressure. The inside of the pressure- and heat-resistant container 13 then is heated with the electric furnace 14. Consequently, a mixed melt of gallium and sodium is generated inside the crucible 15 and nitrogen is blended into the mixed melt to react with gallium. Thus, GaN crystals are generated. The time for which the crystals are grown is not particularly limited but is, for example, 10 hours to 200 hours. When the growth is completed, the supply of the gas is stopped and the temperature is lowered to room temperature. Thereafter, the GaN crystals are taken out of the crucible.

Figure 3:
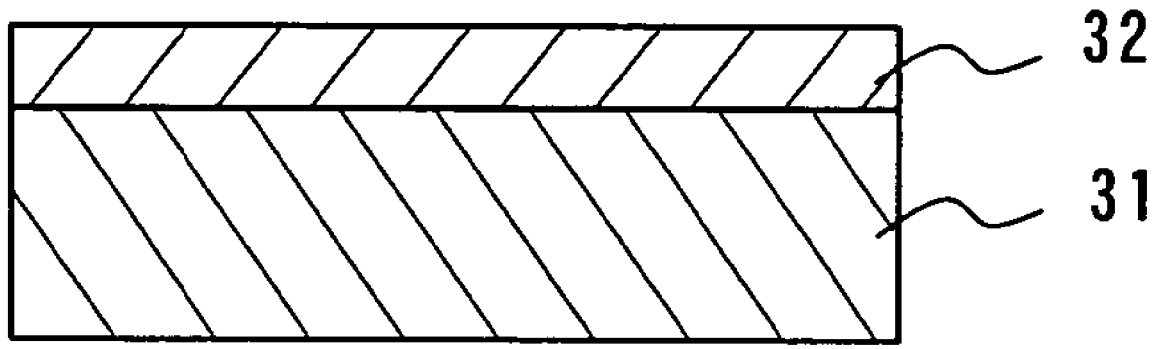
FIG. 3 is a drawing showing the configuration of an example of templates.

Furthermore, the production of GaN may be carried out with GaN crystals to serve as seed crystals having been put in the crucible beforehand. As described earlier, preferably, the seed crystals are those with a GaN crystal layer being formed on a substrate. FIG. 3 shows an example of a substrate (template) to be used in the present invention. As shown in the drawing, a GaN crystal thin film layer 32 is formed on a substrate 31 in this template.

EXAMPLE 1

Next, examples of the present invention are described.

Using the apparatus shown in FIG. 1, GaN crystals were produced under various temperature and pressure conditions. Specifically, first, 1 g of sodium and 0.88 g of gallium (the mole ratio: Ga/(Ga+Na)=27%) were weighed in a glove box, the inside of which had been subjected to nitrogen substitution, and then were put into the BN crucible 15. The Ga used herein was one with a purity of at least 99.9999% (six nines). The Na used herein was purified Na. This crucible 15 was placed inside the pressure- and heat-resistant container 13 made of stainless steal. This then was set in the electric furnace 14. The ambient pressure and growth temperature were controlled with the pressure regulator 12 and the electric furnace 14, respectively. The temperature then was raised from the room temperature to the growth temperature over one hour, was maintained at the growth temperature for 96 hours, and then was lowered to the room temperature over one hour. In this case, the growth temperature was set in the range of 600° C. to 900° C. The growth of crystals was determined through the observation made to determine whether heterogeneous nucleation was caused on the side wall of the BN crucible. The results were plotted corresponding to the temperature and pressure. Thus, the graphs shown in FIGS. 2 and 8 were obtained. In FIG. 2, the curve located on the lower side is a curve showing the minimum pressures that are required for generating GaN crystals.

As shown in FIGS. 2 and 8A, the heterogeneous nucleation was observed at 50 atm ($50 \times 1.013 \times 10^5$ Pa) or higher at 600° C., 15 atm ($15 \times 1.013 \times 10^5$ Pa) or higher at 650° C., 5 atm ($5 \times 1.013 \times 10^5$ Pa) or higher at 700° C., 5 atm ($5 \times 1.013 \times 10^5$ Pa) or higher at 750° C., 10 atm ($10 \times 1.013 \times 10^5$ Pa) or higher at 800° C., 15 atm ($15 \times 1.013 \times 10^5$ Pa) or higher at 850° C., 25 atm ($25 \times 1.013 \times 10^5$ Pa) or higher at 880° C., 40 atm ($40 \times 1.013 \times 10^5$ Pa) or higher at 900° C., and 70 atm ($70 \times 1.013 \times 10^5$ Pa) or higher at 950° C.

Next, the template shown in FIG. 3 was prepared. This template was produced as follows. A GaN crystal thin film layer 32 was formed on a sapphire ($Al_2O_3$ single crystals) substrate 31 by the MOCVD method. Specifically, the sapphire substrate was heated to have a temperature of about 1020° C. to 1100° C. and then trimethylgallium (TMG) and $NH_3$ were supplied onto the substrate. Thus, the GaN crystal thin film layer 32 was formed.

Next, Na, Ga, and the template were set inside the crucible 15 simultaneously and then growth was carried out at various temperatures and pressures for 96 hours. The growth conditions are the same as those mentioned above except that the template was used.

As a result, no nucleation was caused in the ranges of the present invention, i.e. 800° C. and 40 atm ($40 \times 1.013 \times 10^5$ Pa), while large GaN crystals with a thickness of at least 1 mm were formed on the template. However, the generation of a number of nuclei was observed at 800° C. and 60 atm ($60 \times 1.013 \times 10^5$ Pa) and the GaN crystal was of poor quality.

No nucleation was caused at 850° C. and 50 atm ($50 \times 1.013 \times 10^5$ Pa), which are within the ranges of the present invention, and large GaN single crystals with a thickness of at least 1 mm were formed on the template. However, 0.5 g of GaN miscellaneous crystals were formed at 750° C. and 50 atm ($50 \times 1.013 \times 10^5$ Pa) due to the nucleation, and thereby only a thin film with a thickness of 0.1 mm or less was formed on the template. Accordingly, when a higher temperature was employed as the temperature condition, the amount of nitrogen dissolved in the melt and the size of the GaN crystal increased even under a constant pressure and therefore the crystals obtained thereby also formed a thicker film. Furthermore, similarly, no nucleation was caused at 750° C. and 20 atm ($20 \times 1.013 \times 10^5$ Pa), which are within the ranges of the present invention, and GaN single crystals with a thickness of 0.3 mm were formed on the template.

EXAMPLE 2

Next, GaN crystals were produced under various temperature and pressure conditions using the apparatus shown in FIG. 1. First, 10 g of sodium and 8.8 g of gallium (the mole ratio: Ga/(Ga+Na)=27%) were weighed in a glove box, the inside of which had been subjected to nitrogen substitution, and then were put into the alumina crucible 15. The alumina crucible 15 used herein had an inner diameter of 25 mm. The Ga used herein was one with a purity of at least 99.9999% (six nines). The Na used herein was one with a purity of 99.9%. The template used herein was one (with a size of 15 mm) with a 10-μm thick undoped GaN film formed on a sapphire substrate. The crucible 15 was placed inside the pressure- and heat-resistant container 13 made of stainless steel. This then was set in the electric furnace 14. The internal ambient pressure and growth temperature were controlled with the pressure regulator 12 and the electric furnace 14, respectively.

Figure 4:
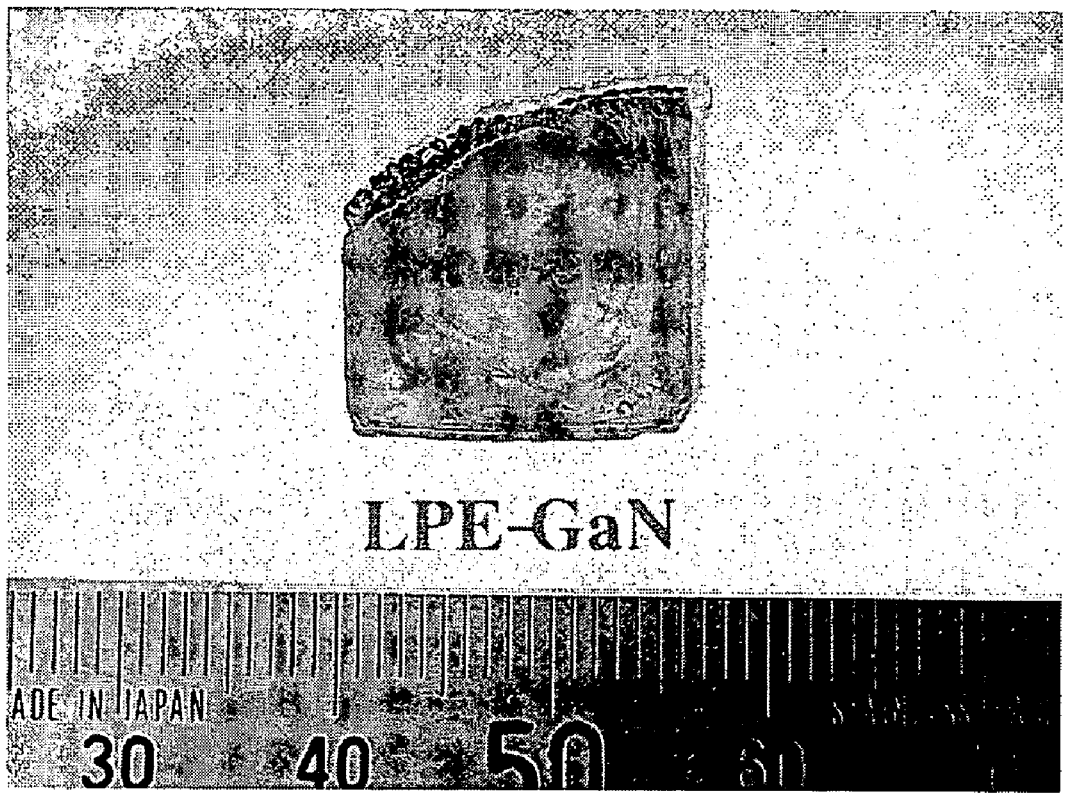
FIG. 4 is a photograph showing the appearance of GaN crystals according to one example of the present invention.

The temperature inside the crucible 15 then was raised from the room temperature to 880° C. over one hour and then the ambient pressure was set at 34 atm ($34 \times 1.013 \times 10^5$ Pa). In this state, the crucible 15 was maintained for 150 hours and then the temperature was lowered to the room temperature over one hour. As a result, perfectly transparent crystals with a thickness of 1 mm were obtained. FIG. 4 shows the crystals thus obtained.

Figure 5:
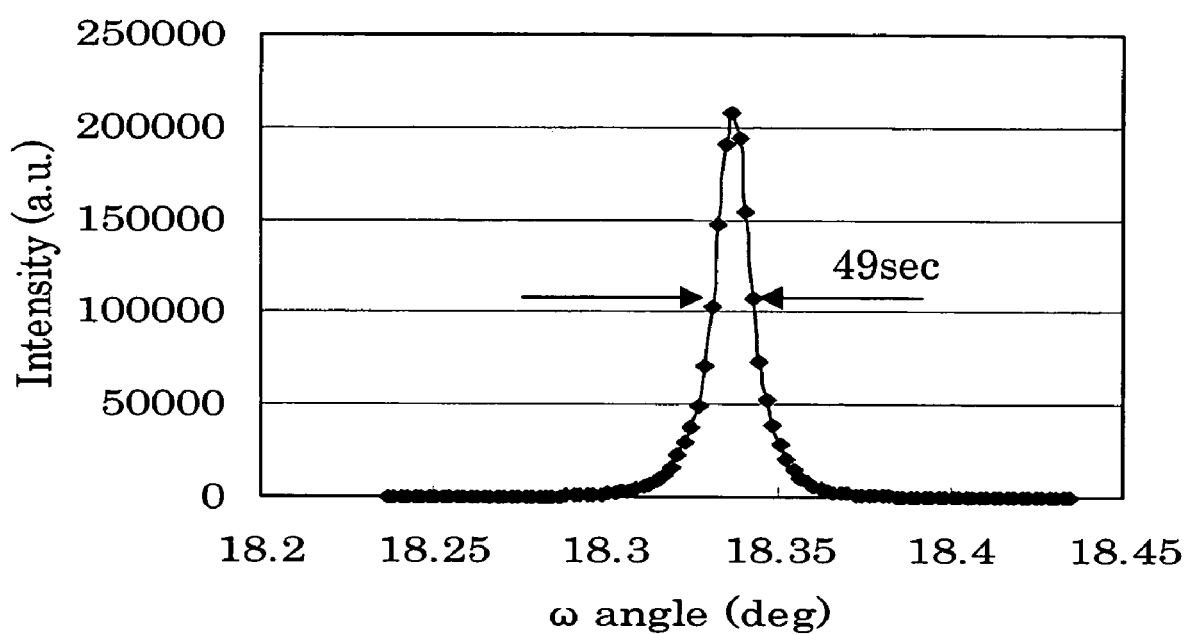
FIG. 5 is a graph showing an X-ray rocking curve of GaN crystals according to one example of the present invention.

The crystals thus obtained were subjected to crystallinity evaluation (the full width at half maximum of a 2-crystal X-ray rocking curve) carried out using X-rays. That is, X-rays emitted from an X-ray source were made to be highly monochromatic through first crystals and then the semiconductor layer that serves as second crystals was irradiated therewith. Then the full width at half maximum (FWHM) whose center was the peak of X-rays diffracted by the semiconductor layer was determined. FIG. 5 shows the results thus obtained. The full width at half maximum of the crystals obtained in this example was 49 seconds. The X-ray source is not particularly limited but, for instance, a CuK alpha-ray source can be used. Furthermore, the first crystals also are not particularly limited but, for example, InP crystals, Ge crystals, etc can be used.

EXAMPLE 3

Figure 6:
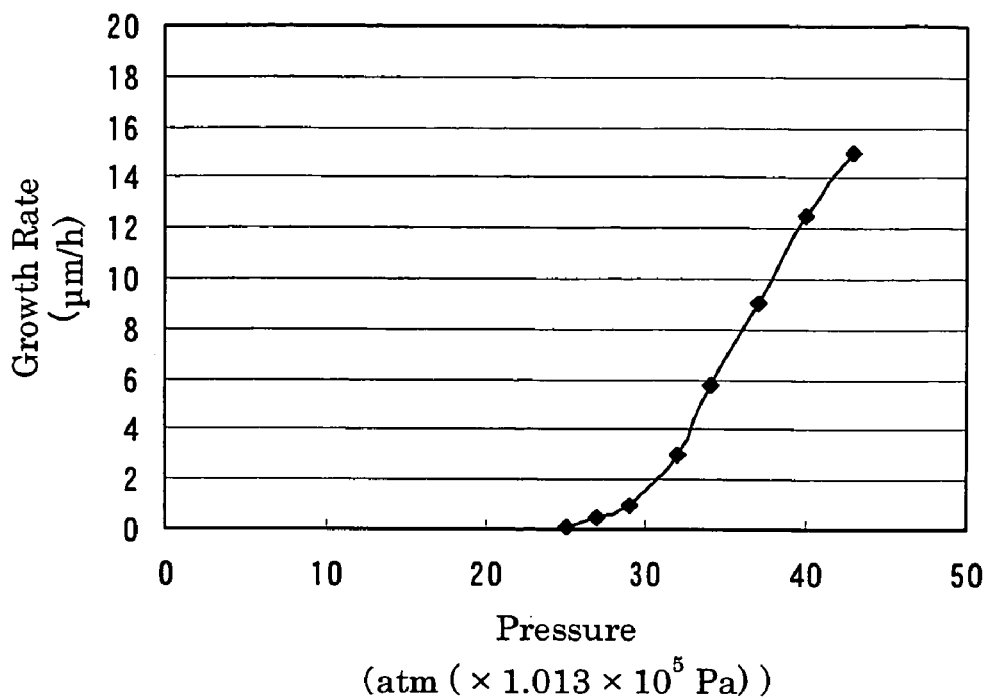
FIG. 6 is a graph showing the relationship between a growth rate and pressure according to one example of the present invention.

In this example, crystals are grown in the same manner as in Example 2 except that the temperature was kept constant at 880° C. and the pressure was changed. The growth rates were determined at various growth pressures. FIG. 6 shows the results. When the pressure was set at lower than 25 atm ($25 \times 1.013 \times 10^5$ Pa), GaN crystals hardly grew on the seed crystals. When the pressure was in the range of 25 atm ($25 \times 1.013 \times 10^5$ Pa) to 30 atm ($30 \times 1.013 \times 10^5$ Pa), only a thin film with a thickness of about 100 μm or less was formed. However, when the GaN crystals were grown for a longer period of time, transparent GaN crystals with several hundred μm were obtained. When the pressure was set at 34 atm ($34 \times 1.013 \times 10^5$ Pa) and the time used for growing crystals was 150 hours (the growth time: 120 hours), 0.7-mm thick GaN crystals were obtained and the growth rate was 5.8 μm/hr. In this case, it took about 30 hours before the melt was supersaturated. When the pressure further was increased and was set at 40 atm ($40 \times 1.013 \times 10^5$ Pa) and the growth time was 150 hours, 1.5-mm thick GaN crystals were obtained and the growth rate was 12.5 μm/hr.

Measurement of Transmittance

Figure 7:
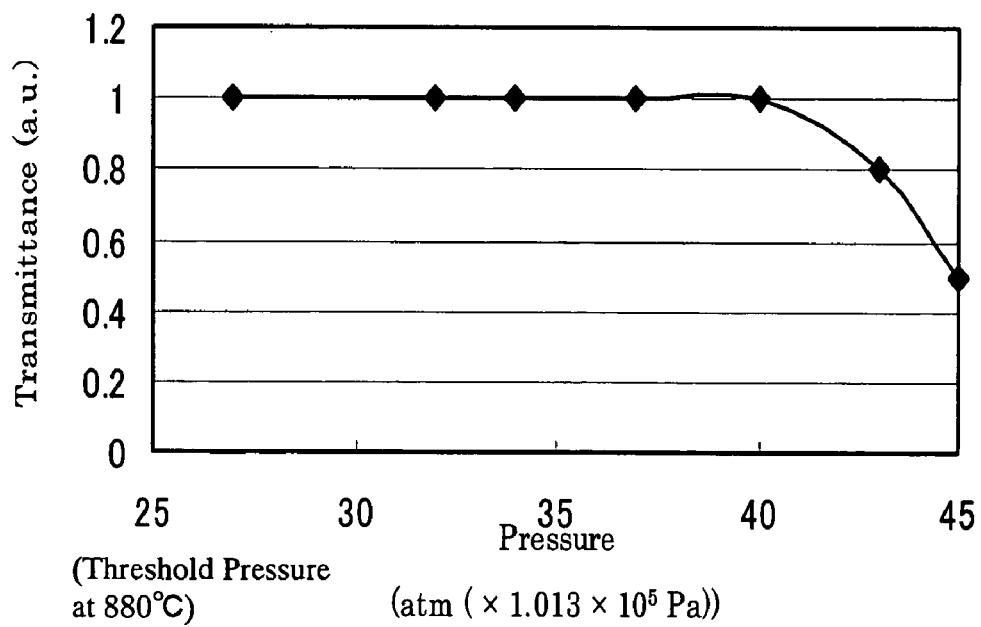
FIG. 7 is a graph showing transmittances of GaN crystals grown at various pressures according to one example of the present invention.

The GaN crystals obtained at the respective pressures in Example 3 were subjected to the measurement of transmittance with respect to visible light (530 nm). FIG. 7 shows the results. Before the measurement was carried out, both sides of the GaN crystals obtained at the respective pressures were polished so that they had planes parallel with a C plane (and had a thickness of 500 μm (but those grown at 27 atm ($27 \times 1.013 \times 10^5$ Pa) and 32 atm ($32 \times 1.013 \times 10^5$ Pa) had a thickness of 300 μm)). The relative evaluation was made with the transmittance of the GaN crystals grown at 34 atm ($34 \times 1.013 \times 10^5$ Pa) being taken as 1. The GaN crystals grown at 40 atm ($40 \times 1.013 \times 10^5$ Pa) or higher absorbed the light. As a result, a pressure of 45 atm ($45 \times 1.013 \times 10^5$ Pa) or lower did not affect the quality to be obtained but a pressure lower than 40 atm (40×1.013×10$^5$ Pa) allowed higher transparency crystals of higher quality to be obtained.

Measurement of Photoluminescence (PL) Intensity

Colored GaN crystals were excited with a HeCd laser (325 nm) and thereby the photoluminescence (PL) intensity was measured. As a result, the spread of luminescence with a wavelength lying at the band edge was observed and the half-value width was at least 100 meV. The same measurement was carried out using transparent GaN crystals and as a result, the half-value width thereof was 50 meV. It has been known that when impurities such as oxygen are contained in crystals, the spectrum of the luminescence with a wavelength lying at the band edge is spread. The impurities contained therein were considered as one of the reasons for blackening. Hence, the preferable level of impurities contained in the surfaces of the GaN crystals may be a level that allows the half-value width of the luminescence with a wavelength lying at the band edge to be 50 meV or less as a result of the PL evaluation.

Measurement of Impurity by SIMS

The impurities contained in black GaN crystals were analyzed by secondary ion mass spectroscopy (SIMS). As a result, impurities detected thereby included, for example, Na, Mg, Ca, Li (impurities contained in Na), O (atmosphere), Fe, and C (contained in, for instance, the pressurized container or crucible materials) and the amount thereof was at least 10 ppm, or about 1000 ppm to 10000 ppm in regions containing a lot of impurities. On the other hand, only trace amounts of Mg, Ca, Fe, and O were detected in transparent GaN crystals. Accordingly, it may be preferable that the impurities present in the surfaces of GaN crystals are kept to a level of 1 ppm or lower, with the P-type and N-type doping materials such as Mg not being taken into account.

As described above, a growth rate as low as several micrometers per hour allows crystals to grow under conditions that introduce less amounts of impurities thereinto and therefore reduces defects to allow higher transparency GaN crystals to be obtained.

From these results, when GaN crystals are grown in the range of pressure P1 (atm(×1.013×10$^5$ Pa) that is expressed by P≦P1≦P+15, where P denotes a threshold pressure (25 atm (25×1.013×10$^5$ Pa) at 880° C.), a further suitable relationship is obtained between the rate at which GaN dissolves in a Ga/Na melt and the rate at which GaN crystals precipitate. As a result, higher transparency crystals of high quality can be obtained. Furthermore, when GaN crystals are grown particularly at a temperature as high as at least 830° C. and in the range of pressure P1 (atm (×1.013×10$^5$ Pa) that is expressed by P≦P1≦P+15, crystals of higher quality can be obtained.

Measurements of GaN Solubility and Nitrogen Solubility in Melt

Figure 8:
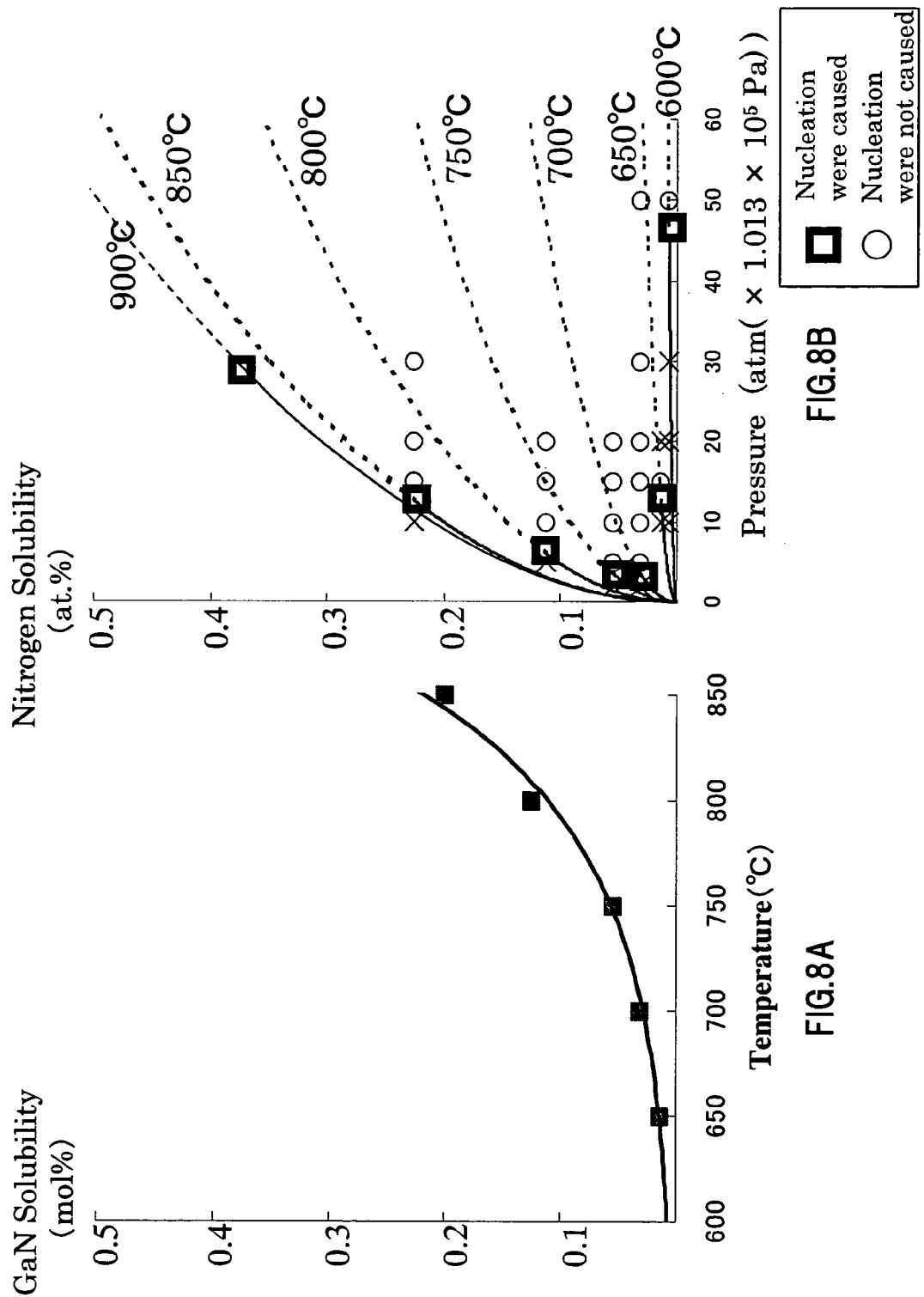
FIG. 8A is a graph showing the temperature of a Ga/Na melt and the solubility of GaN at each temperature according to one example of the present invention.
FIG. 8B is a graph showing the nitrogen pressure and solubility of nitrogen (N) in the Ga/Na melt according to one example of the present invention.
Figure 9:
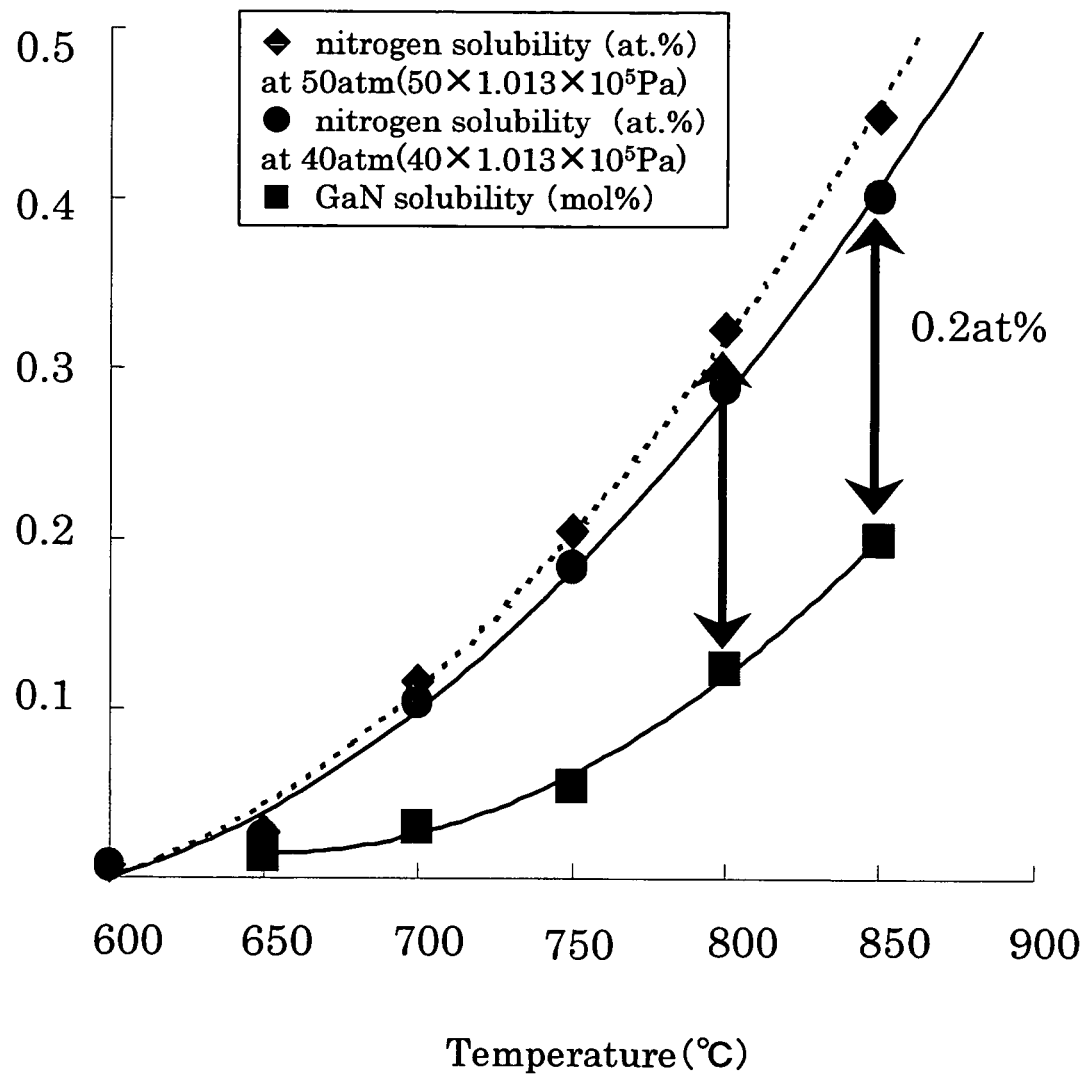
FIG. 9 is a graph showing the temperature of a Ga/Na melt and the solubility of GaN as well as the solubility of nitrogen (N) in the Ga/Na melt at each temperature according to one example of the present invention.

Next, while the temperature of the Ga/Na melt was varied, GaN solubility in the melt was measured. Similarly, while the nitrogen pressure was varied, nitrogen solubility in the melt was measured. The results are shown in FIGS. 8 and 9. FIG. 8A shows the GaN solubility, while FIG. 8B shows the nitrogen solubility. FIG. 9 shows the GaN solubility in the melt that was measured while the temperature of the Ga/Na melt was varied, and the nitrogen solubility in the melt at 50 atm (50×1.013×10$^5$ Pa) and 40 atm (40×1.013×10$^5$ Pa). With respect to the nitrogen solubility, as shown in FIG. 9, the Ga/Na melt was supersaturated with nitrogen by 0.2 at. % at 850° C. and 40 atm (40×1.013×10$^5$ Pa), i.e. the amount of GaN by which the melt was supersaturated therewith was 0.2 mol %, while the Ga/Na melt also was supersaturated with nitrogen by 0.2 at. % at 800° C. and 50 atm (50×1.013×10$^5$ Pa), i.e. the amount of GaN by which the melt was supersaturated therewith was 0.2 mol %. That is, the melt was supersaturated with substantially the same amount of nitrogen under both the conditions described above. When the melt was brought into a state of being supersaturated with nitrogen, the ratio of V/III in the melt increased and thus the crystallinity improved.

When the GaN solubility in the Ga/Na melt at 800° C. was compared with that at 850° C., that at 850° C. was higher. The GaN solubility increased rapidly from the point the temperature reached 830° C. Similarly, in the case where the observation was made to determine whether heterogeneous nucleation was caused on the side wall of the BN crucible while the temperature and pressure were varied (see FIG. 2), the minimum pressure required for generating GaN crystals increased rapidly with the increase in the GaN solubility, at 830° C. or higher. Accordingly, since the solubility increases rapidly from the point the growth temperature has reached 830° C., transparent crystals can be obtained at a certain level of growth rate. On the other hand, from the point the growth temperature reached 950° C., variations in the supersaturation amount caused with the change in the pressure increased. This makes it difficult to control the growth rate. Hence, in order to grow crystals more steadily, it may be preferable that crystals are grown at a temperature in the range of 830° C. to 950° C.

Thus, for example, the supersaturation degree (the supersaturation amount) by which the melt is supersaturated with GaN under each growth condition can be determined using the graph shown in FIG. 9. Accordingly, the optimal growth conditions may be considered in the light of the supersaturation amount.

As a result of growing GaN crystals under the growth condition that the supersaturation amount was 0.15 at. % or less, no heterogeneous nucleation was caused and thereby transparent crystals were obtained.

The growth rate varies depending on the area of the interface between the nitrogen atmosphere and the melt (i.e. the size of the crucible), the growth temperature, and the flux composition. When crystals are grown at a higher growth temperature or when using a mixed flux such as, for instance, Na—Ca or Na—Li, it is possible to improve the solubility of nitrogen or GaN in the melt and thus to obtain a higher growth rate. Accordingly, the suitable growth rate also varies depending on the growth conditions.

The above-mentioned minimum pressure P (atm(×1.013×10$^5$ Pa)) required for generating GaN crystals can be used even when alkali metal or alkaline-earth metal is added to the Ga/Na melt. The control of the supersaturation amount can be applied to any fluxes.

EXAMPLE 4

Next, GaN crystals were produced by a manufacturing method according to another example of the method of manufacturing GaN crystals of the present invention. In this example, the growth temperature was varied to control the growth rate and thereby higher transparency GaN crystals were grown. Specifically, first, a GaN seed substrate with a size of 20 mm×20 mm was placed in an alumina crucible. Next, 10 g of sodium and 8.8 g of gallium (the mole ratio: Ga/(Ga+Na)=27%) were weighed and then were put into the alumina crucible. Thereafter, the crucible was placed in a pressure- and heat-resistant container made of Hastelloy.

The internal pressure of the container was set at 35 atm ($35 \times 1.013 \times 10^5$ Pa). The container was placed inside an electric furnace whose temperature was able to be controlled, and then crystal growth was started.

Figure 10A:
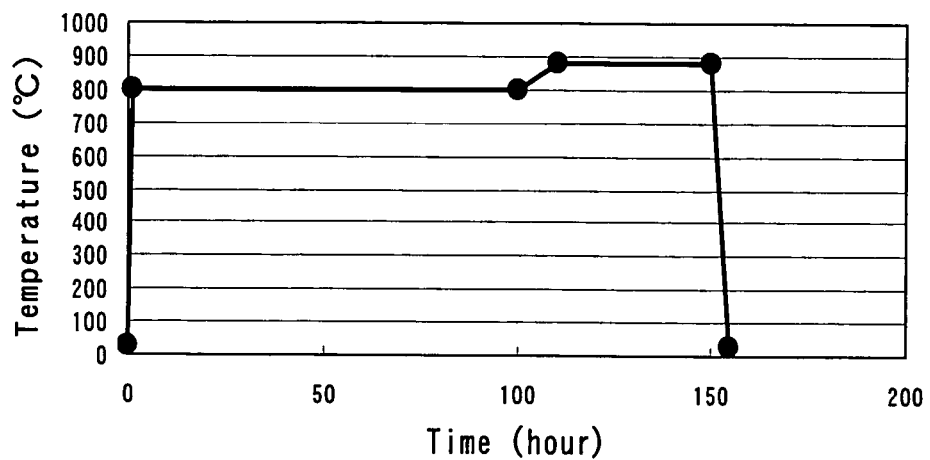
FIGS. 10A and 10B each are graphs showing temperature changes according to one example of the present invention.

Subsequently, the temperature inside the container was raised from the room temperature to 800° C. over one hour. In this state, GaN crystals were grown for 100 hours. Thereafter, the growth temperature was raised to 880° C. over 10 hours. This state was maintained for 40 hours and then cooling was carried out. FIG. 10A shows the relationship between the time and temperature. Such temperature change allows the growth rate to be controlled and therefore crystals with fewer defects can be grown at a higher rate. In this example, two stages of growth rates were employed. The present invention, however, is not limited to this. For instance, another method also can be used in which the growth rate is decreased stepwise using at least three stages of growth rates.

EXAMPLE 5

Figure 10B:
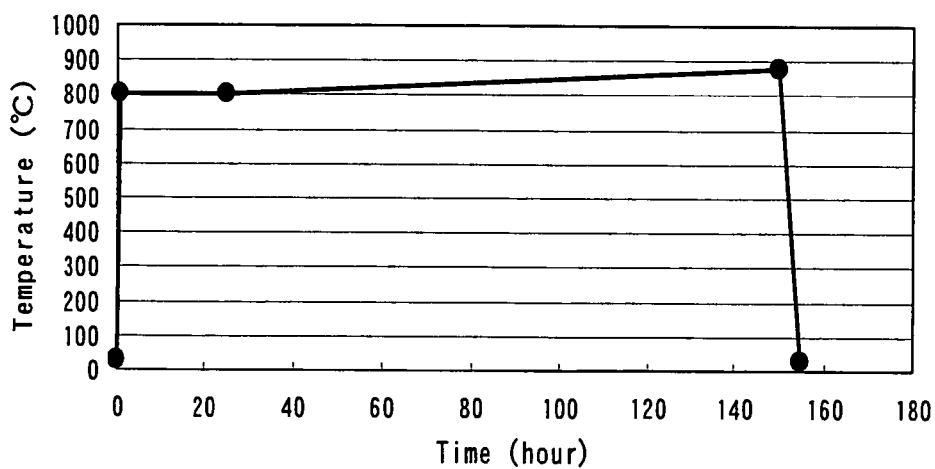

Next, the growth temperature was raised continuously to decrease the growth rate continuously. Consequently, higher transparency GaN crystals were grown. First, crystal growth was started in the same manner as in Example 3. The temperature inside the container then was raised from the room temperature to 800° C. over one hour. In this state, GaN crystals were grown for 24 hours. Thereafter, the growth temperature was raised continuously to 880° C. over 125 hours and then cooling was carried out. FIG. 10B shows the temperature variations with time.

Observation with Optical Microscope

Figure 11:
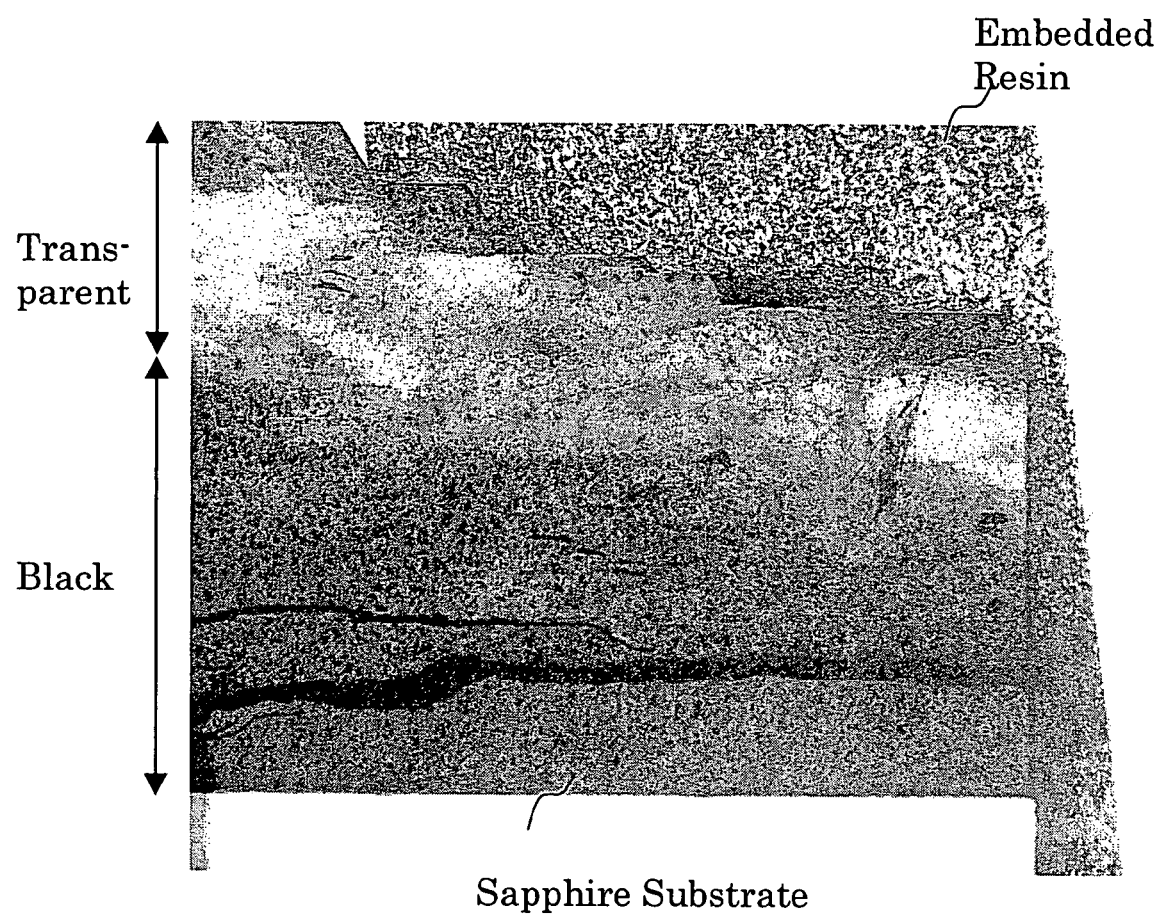
FIG. 11 is a photograph showing a cross-section of GaN crystals according to one example of the present invention.

The crystals thus obtained were observed with an optical microscope. FIG. 11 shows the result. In the GaN crystals that were grown from the seed layer located on the sapphire substrate, it was observed that part of the GaN crystals that was located in the vicinity of the seed substrate was colored but the surface portions of the grown GaN crystals were transparent. The growth rate decreases as the GaN crystals grow from the vicinity of the seed substrate toward their surface portions. Accordingly, in the early stage of the growth, the coloring is caused but high growth rates can be secured while in the later stage of the growth, the growth rate is decreased and thereby transparent crystals were obtained that had low absorptance even with respect to the light in the visible region.

Determination of Impurity Distribution by SIMS

Subsequently, the impurity distribution caused in the thickness direction was determined by the SIMS. Large amounts of Na, Mg, Ca, Li (impurities contained in Na), O (atmosphere), Fe, C (contained in, for instance, the pressurized container or crucible materials), etc. were detected as impurities in the vicinity of the sapphire substrate (the seed layer) as in the results of the observation of black crystals. On the other hand, trace amounts of Mg, Ca, Fe, and O only were detected in the transparent region of the surface portions.

That is, as in the present example, when the growth rate is high in the early stage of the growth and is decreased in the later stage of the growth, crystals include a lot of impurities such as, for example, oxygen, alkali metal, and alkaline-earth metal but can be grown to form a thick film at a high rate in the vicinity of the seed substrate while transparent crystals with fewer defects and impurities can be obtained in the vicinity of their surfaces.

The carrier density distribution caused in the thickness direction of the crystals obtained in the above was determined. As a result, the portions of the GaN crystals located in the vicinity of the seed substrate had a higher carrier density distribution than that of those located in the vicinity of their surfaces.

Measurement of Photoluminescence (PL) Intensity

Crystals were excited with a HeCd laser (325 nm) and thereby the photoluminescence intensity was measured. In the case of luminescence with a wavelength around 362 nm lying at the band edge, the half-value width of luminescence spectrum obtained in the portions of the GaN crystals located in the vicinity of the seed substrate was greater than that obtained in the portions of the GaN crystals located in the vicinity of their surfaces. On the other hand, in the case of luminescence with a wavelength around 420 nm lying in the blue band, the luminescence intensity obtained in the portions of the GaN crystals located in the vicinity of the seed substrate was higher than that obtained in the portions of the GaN crystals located in the vicinity of their surfaces.

The results of the above-mentioned evaluations also indicate that the crystals that are located in the vicinity of their surfaces and have grown at a low growth rate include less impurities and defects than those included in the crystals that are located in the vicinity of the seed substrate and have grown at a high growth rate, and therefore are favorable crystals. The GaN crystals produced by the manufacturing method of the present invention can be manufactured at low cost, with a high growth rate being secured. Consequently, the present invention provides great practical effects.

Device Production

Next, a transparent portion of the surfaces of the GaN crystals obtained above was polished and then a device was produced thereon. As a result, an excellent device property was obtained.

From the results described above, the crystals that were located in the vicinity of the surface and had grown at a lower growth rate have fewer defects and are more favorable crystals as compared to the crystals that were located in the vicinity of the seed substrate and had grown at a higher growth rate.

EXAMPLE 6

Figure 12A:
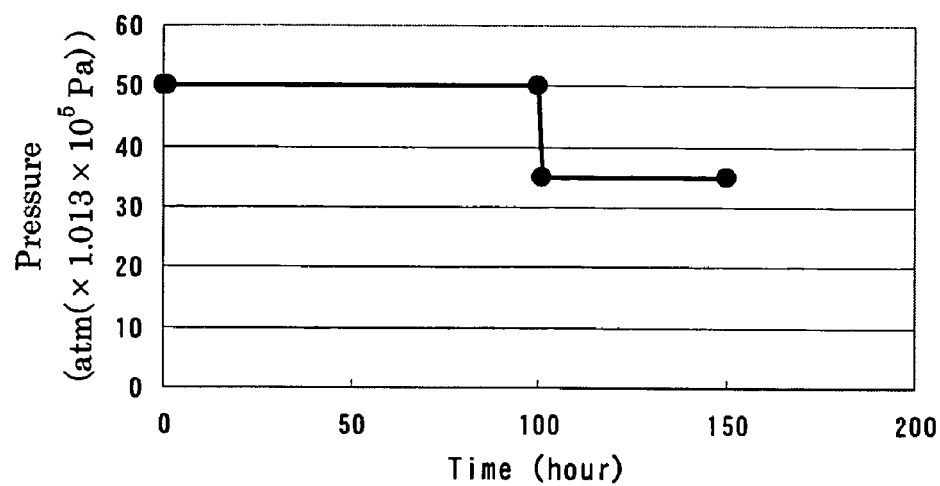
FIGS. 12A and 12B each are graphs showing one example of pressure change according to one example of the present invention.

In this example, the growth pressure was reduced stepwise to decrease the growth rate stepwise. Thus, higher transparency GaN crystals were grown. Specifically, first, the crystal growth was started in the same manner as in Example 3. The temperature inside the container then was raised from the room temperature to 880° C. over one hour. The pressure inside the container was regulated at 50 atm ($50 \times 1.013 \times 10^5$ Pa). In this state, GaN crystals were grown for 100 hours. Thereafter, the pressure inside the container was reduced to 35 atm ($35 \times 1.013 \times 10^5$ Pa). In this state, GaN crystals were grown for 50 hours and then were cooled. FIG. 12A shows the relationship between the time and pressure. In the present example, two stages of growth rates were employed but the present invention is not limited thereto. For instance, another method also can be used in which the growth rate is decreased stepwise using at least three stages of growth rates.

EXAMPLE 7

Figure 12B:
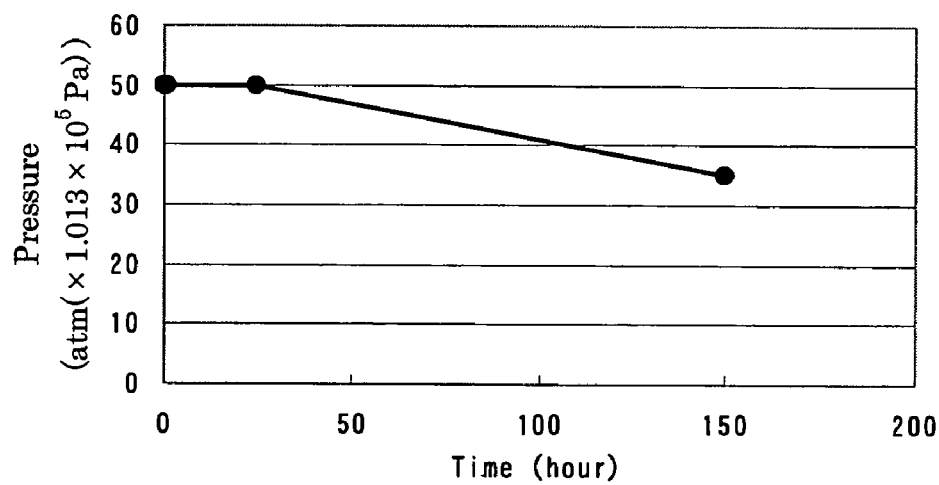

In this example, the growth pressure was reduced continuously to decrease the growth rate continuously. Thus, higher transparency GaN crystals were grown. Specifically, first, the crystal growth was started in the same manner as in Example 3. The temperature inside the container then was raised from the room temperature to 880° C. over one hour. The initial pressure inside the container was set at 50 atm (50×1.013×10⁵ Pa). In this state, GaN crystals were grown for 24 hours. Thereafter, the pressure inside the container was reduced to 35 atm (35×1.013×10⁵ Pa) continuously over 125 hours and then cooling was carried out. FIG. 12B shows the relationship between the time and pressure. As a result, similar effects to those obtained by the method employed in Example 4 were obtained and the surfaces of the GaN crystals thus obtained were transparent and had fewer nitrogen defects.

As described above, when the pressure and temperature are controlled individually, the growth rate is controlled to grow GaN crystals at a higher growth rate in the early stage of their growth and to grow them at a lower growth rate in the later stage of their growth. Accordingly, transparent GaN crystals were obtained that had fewer nitrogen defects and high crystallinity. Consequently, GaN crystals with high crystallinity and fewer dislocations were obtained in a short growth time. In this example, the examination results were those obtained in the case of using the Na flux. However, similar effects were obtained even when another flux was used. For instance, a Na—Ca flux, a Na—Li flux, or a Li flux allows higher solubility to be obtained as compared to the Na flux. However, since such a flux also allows a higher supersaturation degree to be achieved, when the growth rate became too high, crystals obtained thereby tended to be colored. In the same manner as in the present example, when crystals were grown under a pressure in the range where the supersaturation degree is low, i.e. under a pressure that is a little higher than the threshold pressure, transparent GaN crystals were obtained.

As described above, when a higher growth pressure (or a lower temperature) is employed in the early stage of growth while a lower growth pressure (or a higher temperature) is employed in the later stage of the growth, which allows the growth rate to decrease stepwise or continuously, higher transparency GaN crystals with fewer nitrogen defects and high crystallinity can be obtained.

According to the manufacturing method of the present invention, high quality GaN crystals and GaN crystal substrates as well as semiconductor devices including them can be manufactured at low cost under mild conditions of low temperature and low pressure. Consequently, the present invention provides great practical effects.

Specific embodiments and examples described in the detailed description of the present invention are intended merely to clarify the technical details of the present invention. The present invention should not be limited to such specific examples to be understood narrowly. The present invention can be changed variously to be carried out within the spirit of the present invention and the range of the following claims.

What is claimed is:

1. A method of manufacturing GaN crystals, in which in a gas atmosphere containing nitrogen, gallium and the nitrogen are allowed to react with each other to generate and grow GaN crystals on seed crystals in a mixed melt of the gallium and sodium,
wherein the gallium and the nitrogen are allowed to react with each other under a pressurizing condition that exceeds atmospheric pressure, and pressure P1 (atm(×1.013×10⁵ Pa)) in a part or the whole of the pressurizing condition satisfies a condition that is expressed by the following conditional expression (I), and a growth rate at which the GaN crystals grow is decreased stepwise or continuously from surfaces of the seed crystals towards surfaces of the GaN crystals:

$$P \leq P1 < (P+45) \quad (I),$$

where in the expression (I), P (atm(×1.013×10⁵ Pa)) denotes a minimum pressure that is required for generating GaN crystals at a temperature T (° C.) of the mixed melt.

2. The method of manufacturing GaN crystals according to claim 1, wherein the pressure P1 (atm(×1.013×10⁵ Pa)) of the pressurizing condition satisfies a condition that is expressed by the following conditional expression (II) instead of the conditional expression (I):

$$P \leq P1 \leq (P+30) \quad (II),$$

where in the expression (II), P (atm(×1.013×10⁵ Pa)) denotes a minimum pressure that is required for generating GaN crystals at a temperature T (° C.) of the mixed melt.

3. The method of manufacturing GaN crystals according to claim 1, wherein the pressure P1 (atm(×1.013×10⁵ Pa)) of the pressurizing condition satisfies a condition that is expressed by the following conditional expression (III) instead of the conditional expression (I):

$$P \leq P1 \leq (P+15) \quad (II),$$

where in the expression (III), P (atm(×1.013×10⁵ Pa)) denotes a minimum pressure that is required for generating GaN crystals at a temperature T (° C.) of the mixed melt.

4. The method of manufacturing GaN crystals according to claim 1, wherein the temperature T (° C.) of the mixed melt is in a range of 600° C. to 1000° C.

5. The method of manufacturing GaN crystals according to claim 1, wherein the temperature T (° C.) of the mixed melt is in a range of 800° C. to 950° C.

6. The method of manufacturing GaN crystals according to claim 1, wherein the minimum pressure P (atm(×1.013×10⁵ Pa)) that is required for generating GaN crystals at a temperature T (° C.) of the mixed melt is as follows:

| Mixed Melt Temperature T (° C.) | Minimum Pressure P required for generating GaN Crystals (atm (×1.013 × 10⁵ Pa)) |
| --- | --- |
| 600 | 50 |
| 700 | 5 |
| 750 | 5 |
| 800 | 10 |
| 850 | 15 |
| 880 | 25 |
| 900 | 40 |
| 950 | 70. |

7. The method of manufacturing GaN crystals according to claim 1, wherein the pressure P1 (atm(×1.013×10⁵ Pa)) of the heating condition is kept constant and the temperature T (° C.) of the mixed melt is changed.

8. The method of manufacturing GaN crystals according to claim 1, wherein the temperature T (° C.) of the mixed melt is kept constant and the pressure P1 (atm(×1.013×10⁵ Pa)) of the heating condition is changed.

9. The method of manufacturing GaN crystals according to claim 1, wherein in the mixed melt, a mole ratio (%) of the gallium to the total of the gallium and the sodium (Ga/(Ga+Na)) is 7% to 47%.

10. The method of manufacturing GaN crystals according to claim 1, wherein the mixed melt contains at least one additive selected from alkaline-earth metal and alkali metal other than the sodium.

11. The method of manufacturing GaN crystals according to claim 10, wherein the amount of the additive is 1 mol % or less of the whole mixed melt.

12. The method of manufacturing GaN crystals according to claim 10, wherein the amount of the additive is 0.1 mol % or less of the whole mixed melt.

13. The method of manufacturing GaN crystals according to claim 1, wherein the GaN crystals to be grown are GaN single crystals.

14. A method of manufacturing a GaN crystal substrate, comprising:
   preparing seed crystals of a Group III element compound that is expressed by a composition formula of $Al_uGa_vIn_{1-u-v}N$, where u and v satisfy relationships of $0 \leq u \leq 1$, $0 \leq v \leq 1$, and u+v23 1; and
   placing the seed crystals in the mixed melt to grow GaN crystals on surfaces of the seed crystals by a manufacturing method according to claim 1.

15. The method of manufacturing a GaN crystal substrate according to claim 14, wherein the seed crystals are formed as a layer on a substrate, and the substrate then is placed in the mixed melt.

16. The method of manufacturing a GaN crystal substrate according to claim 15, wherein the substrate is a GaAs substrate whose surface is a (111) plane, a Si substrate whose surface is a (111) plane, a sapphire substrate whose surface is a (0001) plane, or a SiC substrate whose surface is a (0001) plane.

17. The method of manufacturing a GaN crystal substrate according to claim 14, wherein the GaN crystals to be grown are GaN single crystals.

18. A method of manufacturing GaN crystals, in which in a gas atmosphere containing nitrogen, gallium and the nitrogen are allowed to react with each other to generate and grow GaN crystals in a mixed melt of the gallium and sodium,
   wherein the gallium and the nitrogen are allowed to react with each other under a pressurizing condition that exceeds atmospheric pressure, and pressure P1 of the pressurizing condition satisfies a condition that is expressed by the following conditional expression (I):

$$P \leq P1 < (P+45) \quad (I),$$

where in the expression (I), P denotes a minimum pressure that is required for generating GaN crystals at a temperature T (° C.) of the mixed melt.

19. The method of manufacturing GaN crystals according to claim 18, wherein the pressure P1 is less than or equal to P+30.

20. The method of manufacturing GaN crystals according to claim 18, wherein the temperature of the mixed melt is in a range of 600° C. to 900° C.

21. The method of manufacturing GaN crystals according to claim 20, wherein the minimum pressure P that is required for generating GaN crystals at a temperature T of the mixed melt is as follows:

| Mixed Melt Temperature T (° C.) | Minimum Pressure P required for generating GaN Crystals (atm) |
| --- | --- |
| 600 | 50 |
| 700 | 5 |
| 750 | 5 |
| 800 | 15 |
| 850 | 20 |
| 900 | 40. |

22. The method of manufacturing GaN crystals according to claim 18, wherein in the mixed melt, a mole ratio of the gallium to the total of the gallium and the sodium (Ga/(Ga+Na)) is 7% to 47%.

23. The method of manufacturing GaN crystals according to claim 18, comprising:
   preparing a Group III element compound semiconductor that is expressed by the following composition formula composition formula: $Al_uGa_vIn_{1-u-v}N$, where u and v satisfy relationships of $0 \leq u \leq 1$, $0 \leq v \leq 1$, and $u+v \leq 1$, and
   placing the same in the mixed melt to grow GaN crystals on a surface of the semiconductor.

24. The method of manufacturing GaN crystals according to claim 23, wherein the semiconductor is formed as a layer on a substrate, and the substrate then is placed in the mixed melt.

25. The method of manufacturing GaN crystals according to claim 24, wherein the substrate is a GaAs substrate whose surface is a (111) plane, a Si substrate whose surface is a (111) plane, a sapphire substrate whose surface is a (0001) plane, or a SIC substrate whose surface is a (0001) plane.

26. The method of manufacturing GaN crystals according to claim 18, wherein the GaN crystals to be grown are GaN single crystals.

27. A method of manufacturing a semiconductor device comprising forming a semiconductor element on a substrate, wherein the substrate is formed by the manufacturing method according to claim 18.

28. The method of manufacturing a semiconductor device according to claim 27, wherein the semiconductor element formed on the substrate is any one of a laser diode, a light emitting diode, and a field effect transistor.

* * * * *

UNITED STATES PATENT AND TRADEMARK OFFICE
CERTIFICATE OF CORRECTION

PATENT NO. : 7,288,152 B2
APPLICATION NO. : 10/884386
DATED : October 30, 2007
INVENTOR(S) : Kitaoka et al.

It is certified that error appears in the above-identified patent and that said Letters Patent is hereby corrected as shown below:

Column 17, line 19: "u + v23 1" should read --u + v $\leq$ 1--.

Signed and Sealed this

Sixth Day of May, 2008

JON W. DUDAS
*Director of the United States Patent and Trademark Office*